United States Patent [19]
Kawakami et al.

[11] Patent Number: 4,859,805
[45] Date of Patent: Aug. 22, 1989

[54] PRINTED WIRING BOARD

[75] Inventors: Shin Kawakami; Satoshi Haruyama; Hirotaka Okonogi; Katutomo Nikaido; Norito Mukai, all of Saitama, Japan

[73] Assignee: Nippon CMK Corp., Japan

[21] Appl. No.: 194,841

[22] Filed: Mar. 29, 1988

[30] Foreign Application Priority Data

Sep. 19, 1987 [JP] Japan ................... 62-235764
Sep. 19, 1987 [JP] Japan ................... 62-235763
Sep. 19, 1987 [JP] Japan ................... 62-235762

[51] Int. Cl.$^4$ ............................................. H05K 1/00
[52] U.S. Cl. .................................. 174/68.5; 361/386; 361/387
[58] Field of Search .............. 174/685; 361/381, 386, 361/387

[56] References Cited

U.S. PATENT DOCUMENTS

| | | | |
|---|---|---|---|
| 3,530,229 | 9/1970 | Burke, Jr. .......................... | 361/381 |
| 3,841,905 | 10/1974 | Dixon, III ........................ | 174/68.5 X |
| 4,339,303 | 7/1982 | Frisch et al. ..................... | 174/68.5 X |
| 4,385,202 | 5/1983 | Spinelli et al. ................... | 174/68.5 X |
| 4,472,762 | 9/1984 | Spinelli et al. ................... | 174/68.5 X |
| 4,481,261 | 11/1984 | Johnson et al. .................. | 174/68.5 X |
| 4,594,473 | 6/1986 | Inoue et al. ...................... | 174/68.5 |

FOREIGN PATENT DOCUMENTS 2904921 8/1980 Fed. Rep. of Germany ..... 174/68.5
12463 1/1977 Japan ................................. 174/68.5

OTHER PUBLICATIONS

Feeley, J. D. et al.; Conductive Pastes; IBM Technical Disclosure Bulletin; vol. II, No. 7; Dec. 1968.

Primary Examiner—Morris H. Nimmo
Attorney, Agent, or Firm—Bruce L. Adams; Van C. Wilks

[57] ABSTRACT

A printed circuit board comprises a base plate and a circuit conductor formed on at least one of the opposed surfaces of the base plate. A heat-radiating film is formed on at least a portion of the surface of the circuit conductor, and an insulating film is formed over the exposed surfaces of the heat-radiating film and the circuit conductor. At least one opening is formed in the insulating film, and the opening overlies the heat-radiating film thereby directly exposing the heat-radiating film to ambient atmosphere so as to promote dissipation of heat from the circuit conductor during use of the printed circuit board. The opening in the insulating film may be in the form of a slot or may comprise a pattern of circular or oval openings. The heat-radiating film may be copper or nickel paste, or non-organic material such as aluminum oxide.

19 Claims, 2 Drawing Sheets

PRINTED WIRING BOARD

BACKGROUND OF THE INVENTION

The present invention relates to a printed circuit board.

A conventional printed circuit board 5 is shown in FIG. 7, and is produced by etching copper film 2 on a copper clad laminated plate 1 to form a desired circuit conductor 3 on the upper surface of a base plate 4.

On the circuit conductor 3 of the printed circuit board 5, an insulating paste film 6 is formed. Such a process is well known, and need not be described in detail.

However, such a conventional printed circuit board 5 of the above described construction has the disadvantage that heat produced during operation of the circuit conductor 3 can not be sufficiently dissipated owing to the insulating property of the paste film 6 which acts as effective electrical and thermal insulation to the circuit conductor 3. Consequently, the circuit conductor 3 may be overheated during use of the printed circuit board 5 to cause erroneous operation or short service life.

An object of the present invention is to eliminate or at least mitigate the above mentioned disadvantage, and to provide an improved printed circuit board which effectively prevents the circuit conductor from overheating.

SUMMARY OF THE INVENTION

According to a feature of the present invention, a printed circuit board having a circuit conductor on at least one surface of a base plate is characterized in that an radiating film covers at least a portion of the outer surface of the circuit conductor.

Preferably, the radiating film is formed by attaching heat radiating paste on the surface of the circuit conductor.

Preferably, the radiating film covers at least a portion of the width of the circuit conductor.

Preferably, the radiating film is formed on the surface of the circuit conductor by painting heat radiating paste formed of metal, such as copper or nickel, or of non-organic material, such as ceramics of aluminum oxide, by painting means such as a silk screen printing process, and hardened.

According to another feature of the present invention, a printed circuit board having a circuit conductor on one or both surfaces of a base plate is characterized in that a heat-radiation film is applied on at least a portion of the surface of the circuit conductor, and that a conventional insulation film is applied on the circuit conductor and in which a slot-like heat-dissipating window is formed on and along the radiating film.

According to another feature of the present invention, a printed circuit board having a circuit conductor on one or both surfaces of a base plate is characterized in that a heat-radiating film is applied on at least a portion of the surface of the circuit conductor, and that a conventional insulation film is applied on the circuit conductor and in which are formed a plurality of spaced heat-dissipating windows which open on and along the radiating film.

The printed circuit board, according to the present invention, performs positive heat dissipating effect by the radiating film formed on at least a portion of the surface of the circuit conductor so that heat produced in the circuit conductor during operation of the printed circuit board can be dissipated effectively. Further, by forming a heat-dissipating window through the insulating film covering the circuit conductor, the heat dissipating effect is enhanced to more effectively prevent overheating or erroneous operation.

DETAILED DESCRIPTION OF PREFERRED EMBODIMENTS

Figure 1:
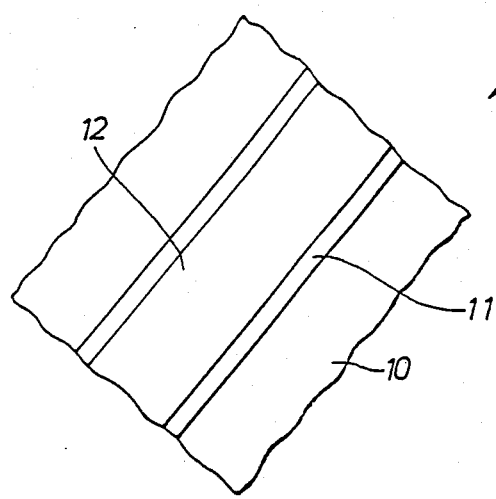
FIGS. 1 and 2 are an enlarged plan view and a sectional view of a portion of a printed circuit board, according to a first embodiment of the present invention.

Some preferred embodiments of the printed circuit board according to the present invention will be described referring to the drawings. In the drawings, the same reference numeral is used to show the same or similar part in the different embodiments for sake of clarity.

Figure 2:
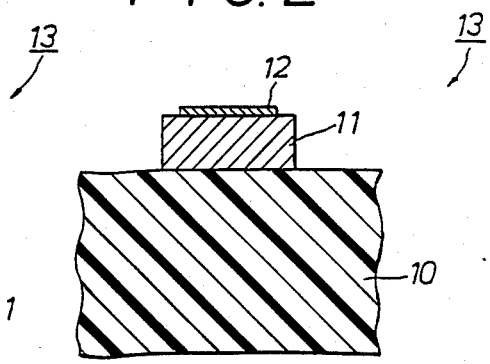

Referring now to FIGS. 1 and 2 which show a first embodiment of the present invention, a base plate 10 of insulating material and a circuit conductor 11 formed on one surface of the base plate 10 is shown. On the surface of the circuit conductor 11, a heat-radiation film 12 is attached, according to the present invention. The radiation film 12 is formed by painting a radiation paste by means, e.g., a silk screen printing process, while producing the printed circuit board, and the paste is hardened. The radiation paste is composed mainly of metal, e.g. copper or nickel, or non-organic material, e.g. ceramics such as aluminum oxide.

In the illustrated embodiment, a printed circuit board having circuit conductor 11 on one surface of the base plate 10 is shown. However, the radiation film 12 can be applied to circuit conductors formed on both surfaces of the base plate or formed as multi-layer conductors.

The illustrated radiation film 12 is narrower than the width of the circuit conductor 11. However, the radiation film 12 may be of the same width as the circuit conductor 11. The radiation film may extend the full length of the circuit conductor 11, or may extend on one or more portions of the circuit conductors, as necessary.

Figure 7:
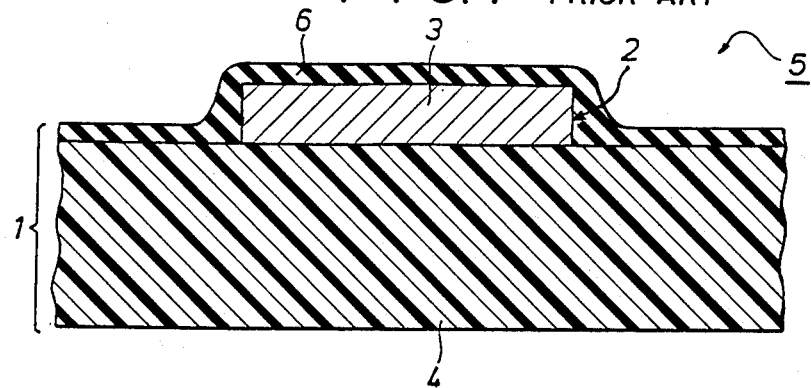
FIG. 7 is an enlarged sectional view of a portion of a conventional printed circuit board.

In the illustrated embodiment, other features of the printed circuit board, e.g. the insulating film 6 shown in FIG. 7, are not shown. However, such features may be added as necessary.

The printed circuit board 13 shown in FIGS. 1 and 2, whether or not an insulating film is formed on the circuit conductor 11, positively dissipates heat produced in the circuit conductor 11 owing to the radiation film 12 so that erroneous operation by overheating is eliminated, and also, the heat resistance property of the circuit conductor 11 is improved by the radiation film 12.

Figure 3:
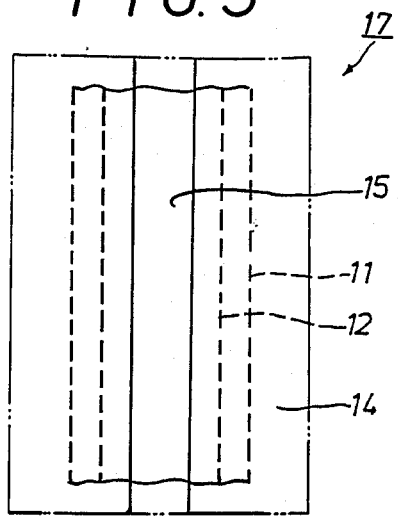
FIGS. 3 and 4 are an enlarged plan view and a sectional view of a portion of a printed circuit board, according to a second embodiment.
Figure 4:
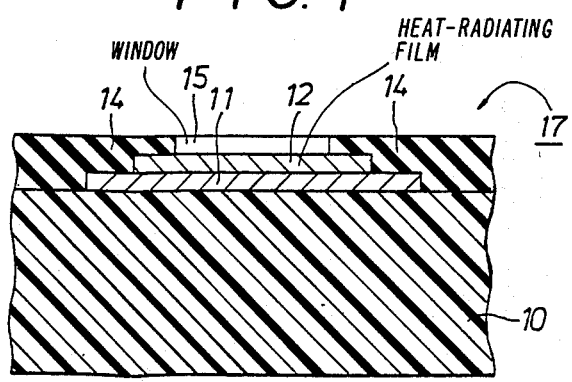

Another printed circuit board 17 shown in FIGS. 3 and 4 is a second embodiment of the present invention.

As before, on the base plate 10 is formed the circuit conductor 11 and the radiation film 12 is formed on the conductor 11. The circuit conductor 11 may be formed on one or both surfaces of the base plate 10. The radiation film 12 may be the same width or narrower than that of the circuit conductor 11.

Further, an insulating film 14 is formed on the circuit conductor 11 and overlies the exposed surfaces of the circuit conductor 11 and the radiation film 12, and a heat-dissipating window or opening 15 formed as a slot along a portion or portions of the radiation film 12, according to the present invention, is formed through the insulating film 14.

The above described printed circuit board 17, according to the second embodiment of the present invention, positively dissipates heat produced in the circuit conductor 11 by the radiation film 12 applied on the conductor 11, and further, as the radiation film 12 is directly exposed to the outside ambient atmosphere by the heat-dissipating window 15, the heat dissipating property of the radiation film 12 is substantially increased. Consequently, erroneous operation of the printed circuit board 17 owing to overheating of the circuit conductor 11 by the heat produced in the conductor during operation is effectively eliminated. Further, the heat resistance property of the circuit conductor 11 is improved by the radiation film 12.

Figure 5:
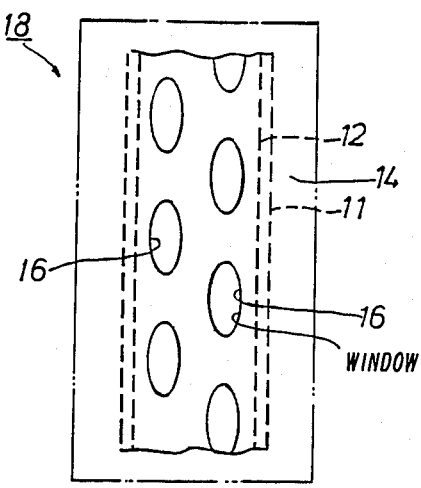
FIGS. 5 and 6 are an enlarged plan view and a sectional view of a portion of a printed circuit board, according to a third embodiment of the present invention.
Figure 6:
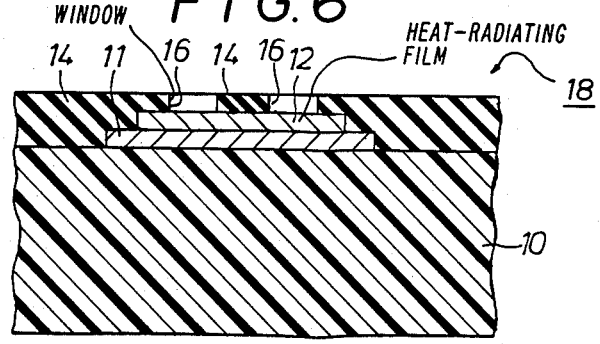

Another printed circuit board 18 shown in FIGS. 5 and 6 is a third embodiment of the present invention.

As before, on the base plate 10 is formed the circuit conductor 11 and the radiation film 12 is formed on the conductor 11. The circuit conductor 11 may be formed on one or both surfaces of the base plate 10. The radiation film 12 may be the same width or narrower than that of the circuit conductor 11.

Further, an insulating film 14 is formed on the circuit conductor 11 and overlies the exposed surfaces of the circuit conductor 11 and the radiation film 12, and a plurality of heat-dissipating windows or opening 16 formed as generally circular or oval openings and arranged in relatively spaced relation along a portion or portions of the radiation film 12, according to the present invention, are formed through the insulating film 14. The number, size and relative spacing of the heat-dissipating windows 16 can be selected as desired considering the amount of heat produced in the circuit conductor 11 at specific portions.

The above described printed circuit board 18, according to the third embodiment of the present invention, positively dissipates heat produced in the circuit conductor 11 by the radiation film 12 applied on the conductor 11, and further, as the radiation film 12 is exposed directly to the outside ambient atmosphere by the heat-dissipating windows 16, the heat dissipating property of the radiation film 12 is substantially increased. Therefore, erroneous operation of the printed circuit board 18 owing to overheating of the circuit conductor 11 by the heat produced in the conductor during operation is effectively eliminated. Further, the heat resistance property of the circuit conductor 11 is improved by the radiation film 12.

As the heat-dissipating windows 16 do not impair the lateral and longitudinal continuity of the insulation film 14, the adhering strength and durability of the insulation film 14 are not decreased compared with the slot-like window 15 shown in FIGS. 3 and 4.

As described, according to the present invention, the printed circuit board effectively improves the heat-dissipating property of the circuit conductor during operation so that erroneous operation owing to overheating of the circuit conductor by the heat produced in the conductor is decreased and the heat resistivity of the circuit conductor is improved so that accuracy and service life of the printed circuit board are improved.

What is claimed is:

1. A printed circuit board comprising: a base plate having opposed major surfaces; a circuit conductor formed on at least one of the base plate surfaces; a heat-radiating film formed on at least a portion of the surface of the circuit conductor; an insulating film formed over the exposed surfaces of the heat-radiating film and the circuit conductor; and means defining at least one opening in the insulating film, the opening overlying the heat-radiating film thereby directly exposing the heat-radiating film to ambient atmosphere to promote dissipation of heat from the circuit conductor during use of the printed circuit board.

2. A printed circuit board according to claim 1; wherein the means defining at least one opening comprises means defining an opening comprised of a slot extending along the heat-radiating film.

3. A printed circuit board according to claim 2; wherein the heat-radiating film comprises a heat-radiating paste applied to the surface of the circuit conductor.

4. A printed circuit board according to claim 2; wherein the heat-radiating film covers at least a portion of the width of the circuit conductor.

5. A printed circuit board according to claim 2; wherein the heat-radiating film is comprised of metal.

6. A printed circuit board according to claim 5; wherein the metal is selected from the group consisting of copper and nickel.

7. A printed circuit board according to claim 2; wherein the heat-radiating film is comprised of non-organic material.

8. A printed circuit board according to claim 7; wherein the non-organic material is comprised of ceramics.

9. A printed circuit board according to claim 8; wherein the ceramics comprises aluminum oxide.

10. A printed circuit board according to claim 1; wherein the means defining at least one opening comprises means defining a plurality of spaced-apart openings all overlying the heat-radiating film.

11. A printed circuit board according to claim 10; wherein the plural openings all have the same shape.

12. A printed circuit board according to claim 10; wherein the plural openings have a generally oval shape.

13. A printed circuit board according to claim 10; wherein the heat-radiating film comprises a heat-radiating paste applied to the surface of the circuit conductor.

14. A printed circuit board according to claim 10; wherein the heat-radiating film covers at least a portion of the width of the circuit conductor.

15. A printed circuit board according to claim 10; wherein the heat-radiating film is comprised of metal.

16. A printed circuit board according to claim 15; wherein the metal is selected from the group consisting of copper and nickel.

17. A printed circuit board according to claim 10; wherein the heat-radiating film is comprised of non-organic material.

18. A printed circuit board according to claim 17; wherein the non-organic material is comprised of ceramics.

19. A printed circuit board according to claim 18; wherein the ceramics comprises aluminum oxide.

* * * * *